(12) United States Patent
Zhang et al.

(10) Patent No.: US 12,066,491 B1
(45) Date of Patent: Aug. 20, 2024

(54) DEVICE AND METHOD FOR DETECTING INTER-TURN ELECTROMAGNETIC PULSE VIBRATION WAVE CHARACTERISTIC OF TURBOGENERATOR ROTOR WINDING

(71) Applicant: HANGZHOU HENUOVA TECHNOLOGY CO., LTD., Hangzhou (CN)

(72) Inventors: Yuewu Zhang, Hangzhou (CN); Kunpeng Tian, Hangzhou (CN); Qianyi Zhang, Hangzhou (CN); Weihua Zha, Hangzhou (CN); Hong Liu, Hangzhou (CN); Xiaohui Cao, Hangzhou (CN); Xueliang Wang, Hangzhou (CN); Dongbing Liu, Hangzhou (CN); Jiamin Li, Hangzhou (CN); Chicheng Liu, Hangzhou (CN); Zhen Lyu, Hangzhou (CN); Chen Fan, Hangzhou (CN); Miaoye Li, Hangzhou (CN); Wen Wei, Hangzhou (CN); Zirui Wang, Hangzhou (CN)

(73) Assignee: HANGZHOU HENUOVA TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 18/289,252

(22) PCT Filed: Apr. 15, 2022

(86) PCT No.: PCT/CN2022/087021
§ 371 (c)(1),
(2) Date: Nov. 2, 2023

(87) PCT Pub. No.: WO2022/233224
PCT Pub. Date: Nov. 10, 2022

(30) Foreign Application Priority Data

May 6, 2021 (CN) .......................... 202110490129.5

(51) Int. Cl.
*G01R 31/34* (2020.01)

(52) U.S. Cl.
CPC .................................. *G01R 31/346* (2013.01)

(58) Field of Classification Search
CPC ..... G01R 31/346; G01R 31/55; G01R 31/343
(Continued)

(56) References Cited

U.S. PATENT DOCUMENTS

| 4,851,766 A * | 7/1989 | Shiobara | G01R 31/346 |
| | | | 324/726 |
| 8,441,264 B2 * | 5/2013 | Wang | G01R 31/346 |
| | | | 324/555 |
| 2015/0276823 A1 * | 10/2015 | Rodriguez | G01R 23/00 |
| | | | 702/75 |

FOREIGN PATENT DOCUMENTS

| CN | 110346685 A | 10/2019 |
| CN | 111521939 A | 8/2020 |

(Continued)

*Primary Examiner* — Giovanni Astacio-Oquendo
(74) *Attorney, Agent, or Firm* — Bayramoglu Law Offices LLC

(57) ABSTRACT

A device and method for detecting an inter-turn electromagnetic pulse vibration wave characteristic of a turbogenerator rotor winding are provided. A signal source and a time sequence control circuit generate a high-potential abrupt electric field; circularly polarized electromagnetic waves generated by a parasitic inductive power supply and symmetrically deflecting by 180° are respectively coupled to a positive electrode and a negative electrode clockwise or counter-clockwise; a first turn on the positive electrode and a first turn on the negative electrode are mutually induced; as time goes by, energy is returned to the parasitic inductive power supply, and is sequentially conducted to a second turn; the parasitic inductive power supply and the second turn further start feeding back energy to the first turn in circular polarization; all turns sequentially perform feedback (Continued)

and superposition one another stage by stage; and all coupling turns show sinusoidal waves with a same time constant.

5 Claims, 15 Drawing Sheets

(58) Field of Classification Search
USPC .................................. 324/765.01, 537, 500
See application file for complete search history.

(56) References Cited

FOREIGN PATENT DOCUMENTS

| | | |
|---|---|---|
| CN | 111965541 A | 11/2020 |
| CN | 212845842 U | 3/2021 |
| CN | 113406540 A | 9/2021 |
| JP | 2007163196 A | 6/2007 |

* cited by examiner

DEVICE AND METHOD FOR DETECTING INTER-TURN ELECTROMAGNETIC PULSE VIBRATION WAVE CHARACTERISTIC OF TURBOGENERATOR ROTOR WINDING

CROSS REFERENCE TO THE RELATED APPLICATIONS

This application is the national phase entry of International Application No. PCT/CN2022/087021, filed on Apr. 15, 2022, which is based upon and claims priority to Chinese Patent Application No. 202110490129.5, filed on May 6, 2021, the entire contents of which are incorporated herein by reference.

TECHNICAL FIELD

The present disclosure provides a device and method for detecting an inter-turn electromagnetic pulse vibration wave characteristic of a turbogenerator rotor winding, and belongs to the technical field of inter-turn detection for turbogenerator rotor windings.

BACKGROUND

At present, to detect a state of a rotor winding of a large non-salient-pole turbogenerator, there are a lumped parameter detection method including a direct-current (DC) resistance, an insulation resistance, an alternating-current (AC) impedance, and a high-frequency AC impedance, and a distributed parameter detection method such as an open transformer method, a voltage distribution method, a recurrent surge oscillograph (RSO) single-pulse method, and a large-coil single AC pulse test method in home and abroad. An inter-turn state of the winding is detected roughly, and only accumulative characteristics on coils of the rotor winding can be determined probably. Most waveforms can only be analyzed overall, or only the large coil is analyzed in detail. Electromagnetic wave characteristics of each turn cannot be analyzed more accurately, comprehensively, completely and intuitively. Concerning coupling electromagnetic wave characteristics of each turn of the winding, neither corresponding theories nor specific detection methods are provided. Therefore, waveform data cannot be analyzed accurately.

SUMMARY

An objective of the present disclosure is to provide a device and method for detecting an inter-turn electromagnetic pulse vibration wave characteristic of a turbogenerator rotor winding, to overcome the above detection defects. The present disclosure can show true electromagnetic characteristics of each clockwise or counter-clockwise symmetrically corresponding turn of a winding on a positive electrode and a negative electrode clearly, simply and intuitively in one-to-one correspondence.

To achieve the above objective, the present disclosure provides a device for detecting an inter-turn electromagnetic pulse vibration wave characteristic of a turbogenerator rotor winding, including an ultra-large-capacity internal resistance signal source, where the ultra-large-capacity internal resistance signal source is connected to an ultra-high-speed time sequence control circuit, the ultra-high-speed time sequence control circuit is connected to a positive electrode and a negative electrode of a rotor winding through a parasitic inductive power supply via a positive electrode load wave guiding line and a negative electrode load wave guiding line, and the positive electrode and the negative electrode of the rotor winding are connected to an ultra-high-speed acquisition circuit through an operational amplifier circuit.

Preferably, the ultra-large-capacity internal resistance signal source matches with an average time constant of a circular polarization characteristic for each turn of the winding, and can generate an energy width of a power circular polarization characteristic wave matching with a full response time constant of the rotor winding;

the parasitic inductive power supply performs circular waveguide coupling exchange on input and output coupling circularly polarized waves (CPWs) of the positive electrode and the negative electrode;

the positive electrode load wave guiding line and the negative electrode load wave guiding line couple CPWs concurrently to a positive electrode and a negative electrode of a rotor;

the operational amplifier circuit combines, couples and amplifies signals for concurrent circularly-polarized transmission and reception; and the ultra-high-speed acquisition circuit acquires a waveform depending on a circularly polarized dual-signal emission source, an induced polarization source at each turn, a disymmetric circularly polarized waveguide load, and a time constant for maintaining energy of the signal source.

The present disclosure provides a method for detecting an inter-turn electromagnetic pulse vibration wave characteristic of a turbogenerator rotor winding, where the ultra-large-capacity internal resistance signal source and the ultra-high-speed time sequence control circuit generate a high-potential abrupt electric field for an avalanche polarized edge; circularly polarized electromagnetic waves generated by the parasitic inductive power supply and symmetrically deflecting by 180° are respectively coupled to the positive electrode and the negative electrode of the rotor clockwise or counter-clockwise through the positive electrode load wave guiding line and the negative electrode load wave guiding line; a first turn on the positive electrode and a first turn on the negative electrode are mutually induced to generate a first sinusoidal wave; as time goes on, energy is returned to the parasitic inductive power supply, and is sequentially conducted to a second turn; the parasitic inductive power supply and the second turn further start feeding back energy in circular polarization; all turns sequentially perform feedback and superposition one another stage by stage; and all coupling turns show sinusoidal waves with a same time constant.

Preferably, when time of a unidirectional energy field for clockwise maintaining circularly polarized transmission of the positive electrode and time of a unidirectional energy field for clockwise maintaining 180°-deflecting circularly polarized transmission of the negative electrode are greater than a full-length waveguide time of the rotor winding at the same time, each turn of a symmetric winding shows a characteristic waveform of a signal source and load superposed dual electromagnetic pulse vibration wave; through self-induction and mutual induction, a CPW waveform formed by a present turn is synchronously superposed and coupled in time to obtain a forward changing flux from top to bottom; if the present turn has a complete sinusoidal wave, and a wavelength time constant changes little, the present symmetric turn has a complete electromagnetic characteristic; if the present turn has an incomplete sinusoidal wave, and a wavelength of a forward and backward superposed sinusoidal wave is greater than a standard time constant, the present turn is defective and has a health hazard such as deformation, oil pollution, slot wedge loosening or displacement, and an early inter-turn short circuit.

Preferably, a unidirectional energy field counter-clockwise applied for circular polarization of the positive electrode and a unidirectional energy field counter-clockwise applied for 180°-deflecting circular polarization of the negative electrode are acquired symmetrically for comparison; two CPWs with a same rotation direction are used to couple a counter-clockwise CPW waveform formed by a present turn to form a reversely changing flux from bottom to top; and a defective turn can be verified repeatedly to determine a position of a defect on the winding of the positive electrode and the negative electrode.

Preferably, when a unit length of a load on each turn of the rotor is an integer multiple of a wavelength of a transmitted CPW, a load of the tested rotor is a dielectric material (Ur=1), and an electromagnetic wave has an attenuation constant and a phase constant given by:

$$\begin{cases} \alpha_s = 2\left(\dfrac{\pi f}{c}\right)^2 \dfrac{\varepsilon_r''}{\beta_s} \\ \beta_s = \dfrac{2\pi f}{c}\left(\dfrac{\varepsilon_r' + \sqrt{(\varepsilon_r')^2 + (\varepsilon_r'')^2}}{2}\right)^{\frac{1}{2}} \end{cases}$$

where $\alpha_s$ is the attenuation constant, $\beta_s$ is the phase constant, c is a light velocity in vacuum, f is a frequency of the generated electromagnetic wave, $\varepsilon_s$ is a permittivity of free space, namely $10^{-9}/36\pi$ F/m, $\varepsilon_r$ is a relative dielectric constant for each turn of the winding, and $\varepsilon_r = \varepsilon_r' - j\varepsilon_r''$, $\varepsilon_r'$ being a real part of the relative dielectric constant for each turn of the winding, and $\varepsilon_r''$ being an imaginary part of the relative dielectric constant for each turn of the winding; and the wavelength of the CPW in the rotor winding is given by:

$$\lambda_s = \dfrac{2\pi}{\beta_s} = \lambda_0\left[\dfrac{\varepsilon_r' + \sqrt{(\varepsilon_r')^2 + (\varepsilon_r'')^2}}{2}\right]^{-\frac{1}{2}}$$

where, $\lambda_0 = c/f$ is a free space wavelength of the CPW, $\lambda_s$ is an average wavelength of the CPW in the rotor winding, and when a perimeter for a single turn of the rotor winding is an integer multiple of ½ of the wavelength of the transmitted electromagnetic wave, namely $$l = \dfrac{n\lambda_s}{2},$$

n being a positive integer, a propagation coefficient $T^2$ can be given by:

$$T^2 = \exp\left[-\dfrac{2n\pi\varepsilon_r''}{\varepsilon_r' + \sqrt{(\varepsilon_r')^2 + (\varepsilon_r'')^2}} - j2n\pi\right],$$

where the propagation coefficient may truly reflect a time constant of an inductive impedance of an internal resistance.

Beneficial Effects

The present disclosure can accurately measure a health condition for each turn of the generator rotor winding, and determine whether the generator rotor winding has a fault or a fault trend. The present disclosure can accurately locate a fault type and a fault position of the rotor on each turn of the rotor winding. The present disclosure serves as an important method for nondestructive testing in a whole life cycle of the rotor in the large non-salient-pole turbogenerator, and can provide accurate and clear data and key evidences for manufacture, delivery inspection and overhauling of the rotor.

DETAILED DESCRIPTION OF THE EMBODIMENTS

Embodiment 1

Figure 1:
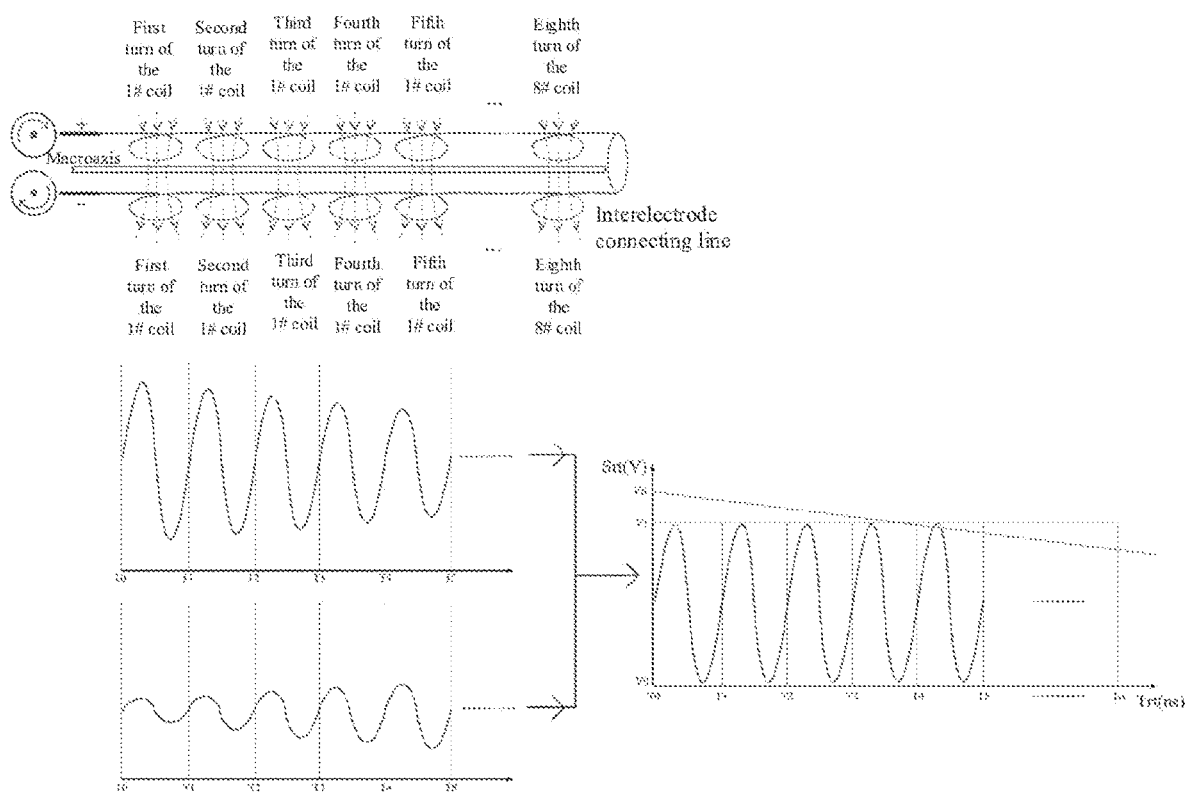
FIG. 1 illustrates an oscillogram of a CPW concurrently coupled clockwise in time and formed by a present turn.
Figure 2:
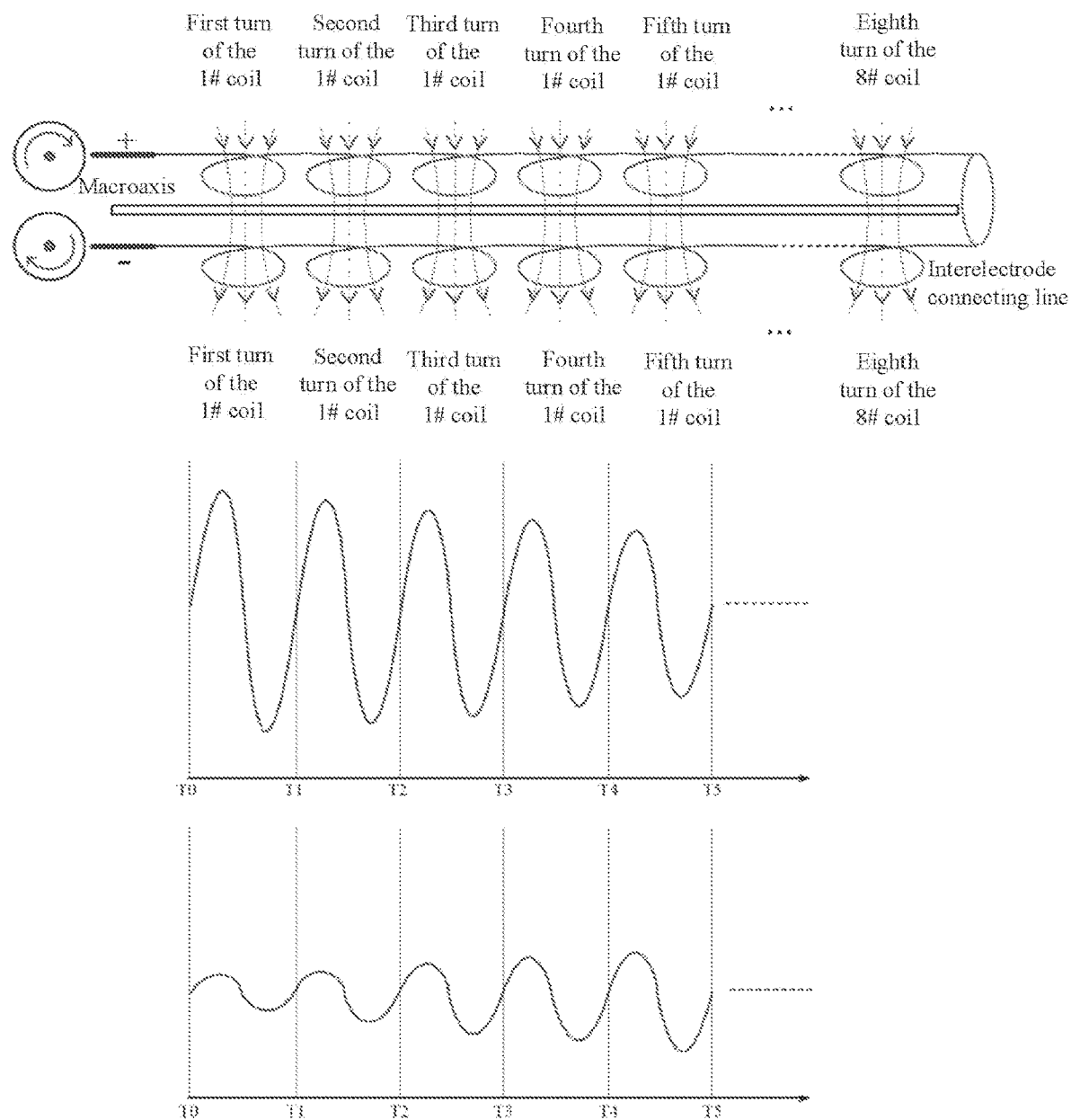
FIG. 2 illustrates an oscillogram fed back by accumulating a CPW waveform formed by each turn of a present coil clockwise.
Figure 3:
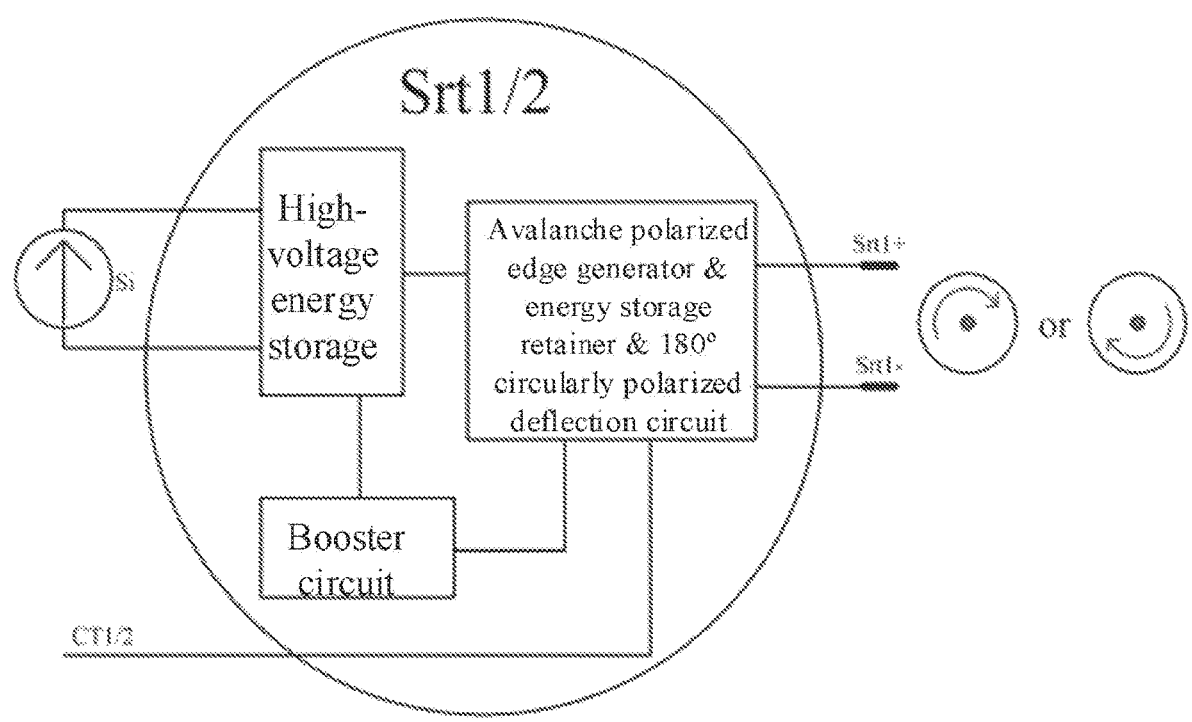
FIG. 3 is a schematic structural view of a signal source.
Figure 4:
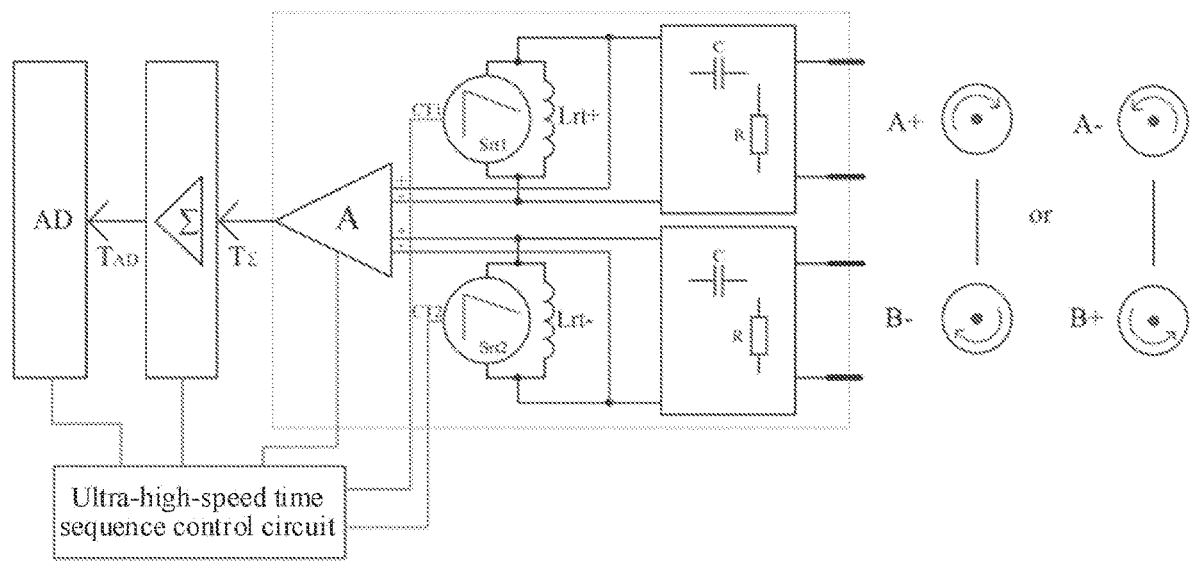
FIG. 4 is a schematic view of an operational amplifier circuit, a filter circuit, an acquisition circuit, and a control circuit.
Figure 5:
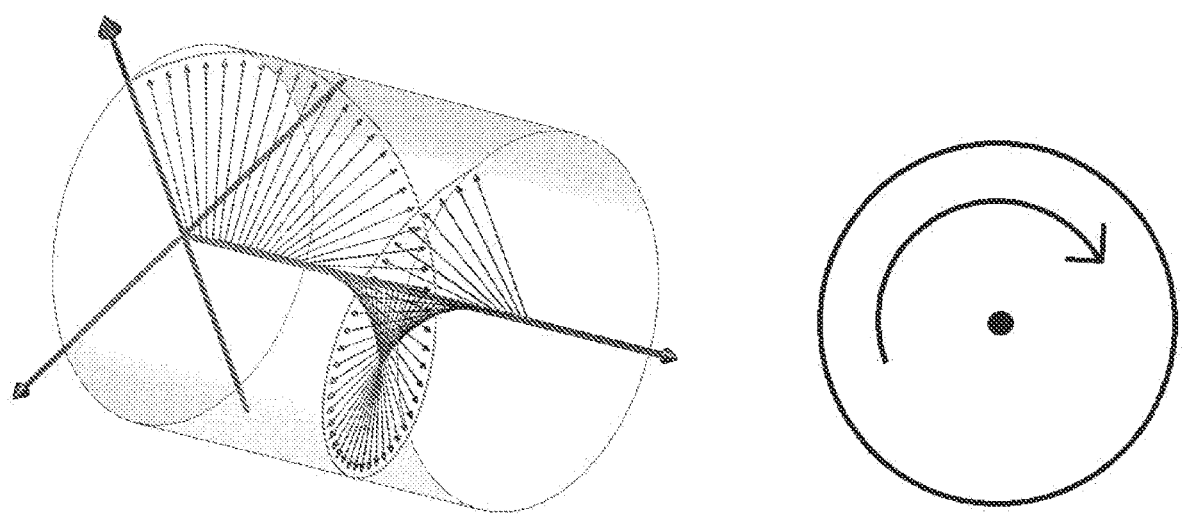
FIG. 5 is a schematic view of a clockwise CPW.
Figure 6:
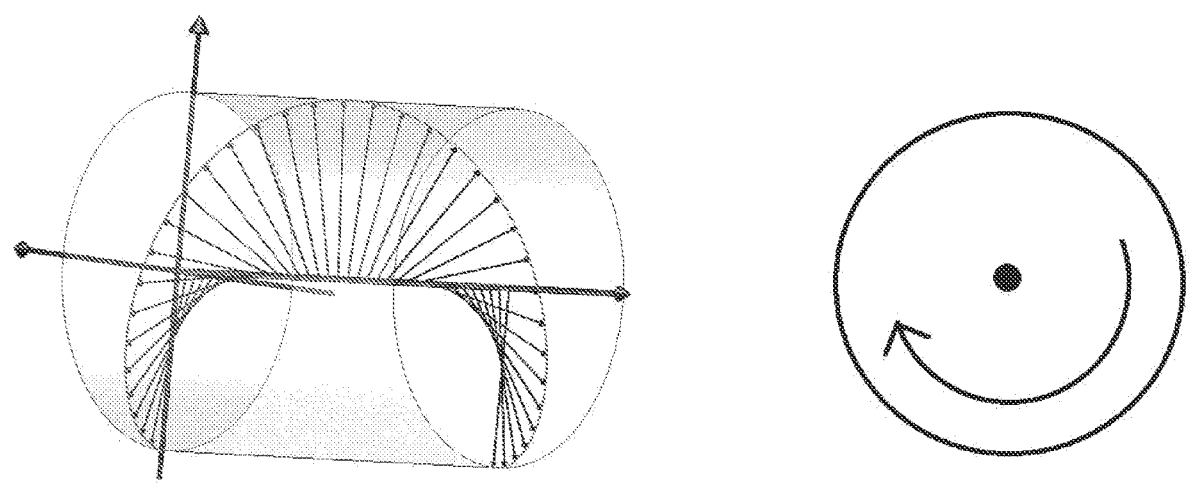
FIG. 6 is a schematic view of a clockwise 180°-deflecting CPW.
Figure 7:
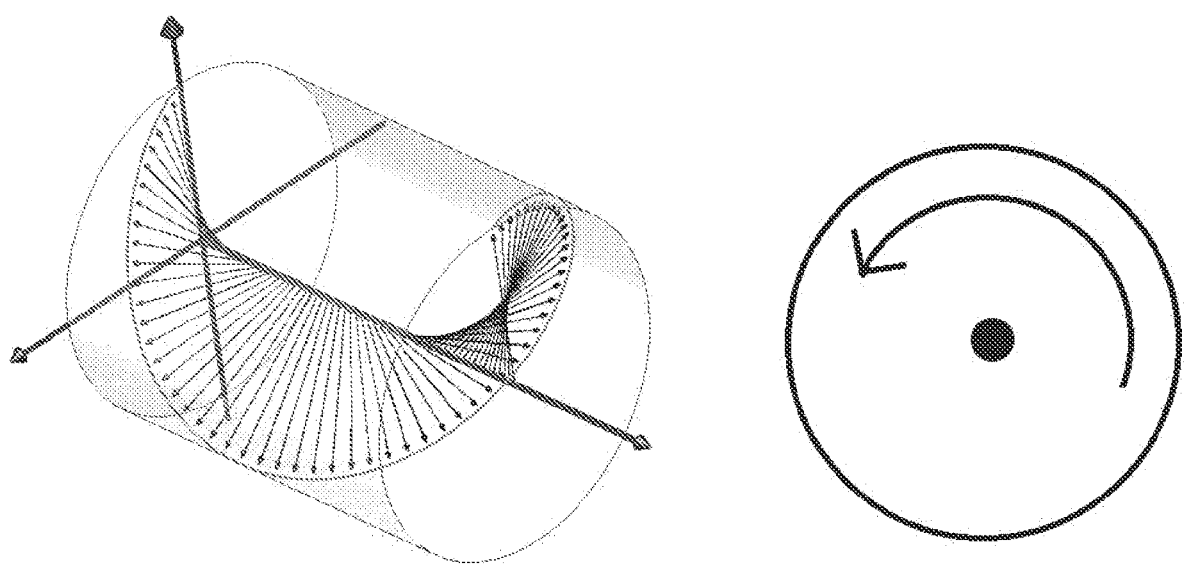
FIG. 7 is a schematic view of a counter-clockwise CPW.
Figure 8:
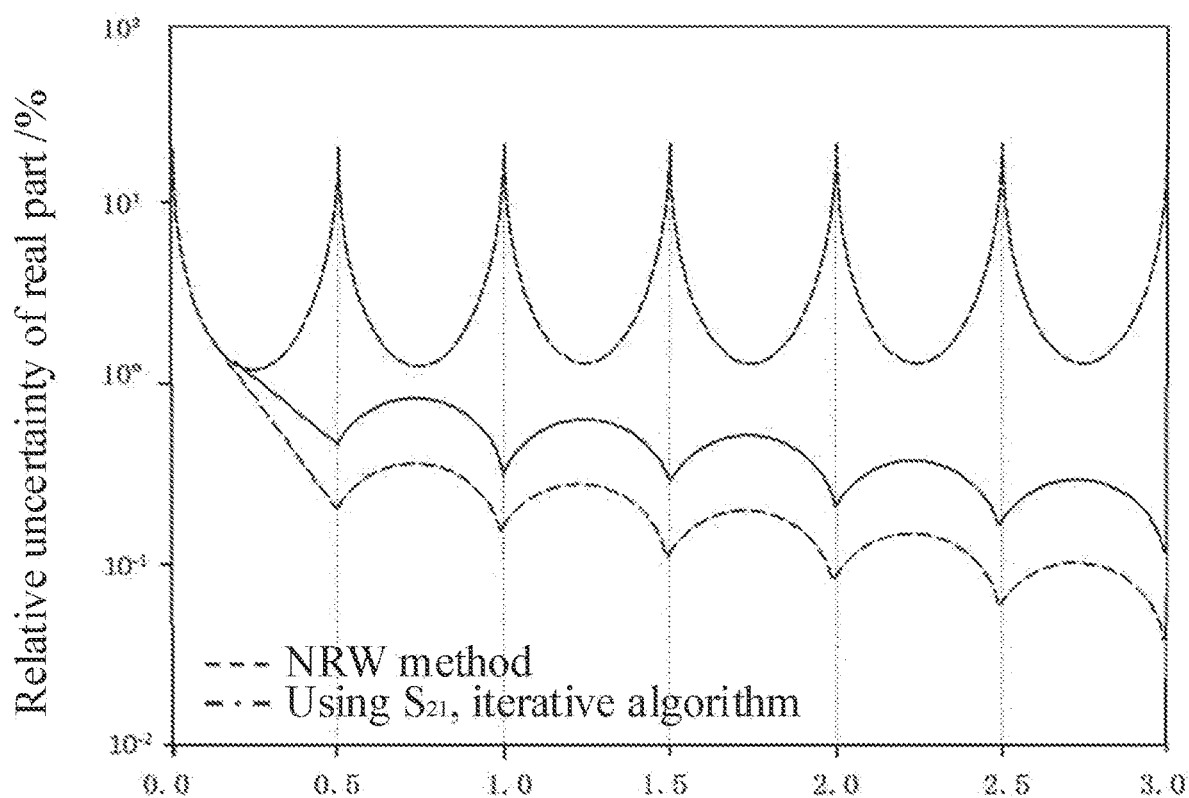
FIG. 8 is a schematic view of a time constant of an inductive impedance of an equivalent internal resistance.

A shown in FIGS. 1-8, the present disclosure provides a device for detecting an inter-turn electromagnetic pulse vibration wave characteristic of a turbogenerator rotor winding, including an ultra-large-capacity internal resistance signal source. The ultra-large-capacity internal resistance signal source is connected to an ultra-high-speed time sequence control circuit. The ultra-high-speed time sequence control circuit is connected to a positive electrode and a negative electrode of a rotor winding through a parasitic inductive power supply via a positive electrode load wave guiding line and a negative electrode load wave guiding line. The positive electrode and the negative electrode of the rotor winding are connected to an ultra-high-speed acquisition circuit through an operational amplifier circuit.

The ultra-large-capacity internal resistance signal source matches with an average time constant of a circular polarization characteristic for each turn of the winding, and can generate an energy width of a power circular polarization characteristic wave matching with a full response time constant of the rotor winding.

The parasitic inductive power supply performs circular waveguide coupling exchange on input and output coupling CPWs of the positive electrode and the negative electrode.

The positive electrode load wave guiding line and the negative electrode load wave guiding line couple CPWs concurrently to a positive electrode and a negative electrode of a rotor.

The operational amplifier circuit combines, couples and amplifies signals for concurrent circularly polarized transmission and reception.

The ultra-high-speed acquisition circuit acquires a waveform depending on a circularly polarized dual-signal emission source, an induced polarization source at each turn, a disymmetric circularly polarized waveguide load, and a time constant for maintaining energy of the signal source.

The present disclosure provides a method for detecting an inter-turn electromagnetic pulse vibration wave characteristic of a turbogenerator rotor winding. The ultra-large-capacity internal resistance signal source and the ultra-high-speed time sequence control circuit generate a high-potential abrupt electric field for an avalanche polarized edge. Circularly polarized electromagnetic waves generated by the parasitic inductive power supply and symmetrically deflecting by 180° are respectively coupled to the positive electrode and the negative electrode of the rotor clockwise or counter-clockwise through the positive electrode load wave guiding line and the negative electrode load wave guiding line. A first turn on the positive electrode and a first turn on the negative electrode are mutually induced to generate a first sinusoidal wave. Energy is returned to the parasitic inductive power supply, and is sequentially conducted to a second turn. The parasitic inductive power supply and the second turn further start feeding back energy in circular polarization. All turns sequentially perform feedback and superposition one another stage by stage. All coupling turns show sinusoidal waves with a same time constant.

When time of a unidirectional energy field for clockwise maintaining circularly polarized transmission of the positive electrode and time of a unidirectional energy field for clockwise maintaining 180°-deflecting circularly polarized transmission of the negative electrode are greater than a full-length waveguide time of the rotor winding at the same time, each turn of a symmetric winding shows a characteristic waveform of a signal source and load superposed dual electromagnetic pulse vibration wave. Through self-induction and mutual induction, a CPW waveform formed by a present turn can be synchronously superposed and coupled in time to obtain a forward changing flux from top to bottom. If the present turn has a complete sinusoidal wave, and a wavelength time constant changes little, the present symmetric turn has a complete electromagnetic characteristic. If the present turn has an incomplete sinusoidal wave, and a wavelength of a forward and backward superposed sinusoidal wave is greater than a standard time constant, the present turn is defective and has a health hazard such as deformation, oil pollution, slot wedge loosening or displacement, and an early inter-turn short circuit.

A unidirectional energy field counter-clockwise applied for circular polarization of the positive electrode and a unidirectional energy field counter-clockwise applied for 180°-deflecting circular polarization of the negative electrode are acquired symmetrically for comparison. Two CPWs with a same rotation direction are used to couple a counter-clockwise CPW waveform formed by a present turn to form a reversely changing flux from bottom to top. A defective turn can be verified repeatedly to determine a position of a defect on the winding of the positive electrode and the negative electrode.

When a unit length of a load on each turn of the rotor is an integer multiple of a wavelength of a transmitted CPW, a load of the tested rotor is a dielectric material (Ur=1), and an electromagnetic wave has an attenuation constant and a phase constant given by:

$$\begin{cases} \alpha_s = 2\left(\dfrac{\pi f}{c}\right)^2 \dfrac{\varepsilon_r''}{\beta_s} \\ \beta_s = \dfrac{2\pi f}{c}\left(\dfrac{\varepsilon_r' + \sqrt{(\varepsilon_r')^2 + (\varepsilon_r'')^2}}{2}\right)^{\frac{1}{2}} \end{cases}$$

where $\alpha_s$ is the attenuation constant, $\beta_s$ is the phase constant, c is a light velocity in vacuum, f is a frequency of the generated electromagnetic wave, $\varepsilon_s$ is a permittivity of free space, namely $10^{-9}/36\pi$ F/m, $\varepsilon_r$ is a relative dielectric constant for each turn of the winding, and $\varepsilon_r = \varepsilon_r' - j\varepsilon_r''$, $\varepsilon_r'$ being a real part of the relative dielectric constant for each turn of the winding, and $\varepsilon_r''$ being an imaginary part of the relative dielectric constant for each turn of the winding; and the wavelength of the CPW in the rotor winding is given by:

$$\lambda_s = \dfrac{2\pi}{\beta_s} = \lambda_0 \left[\dfrac{\varepsilon_r' + \sqrt{(\varepsilon_r')^2 + (\varepsilon_r'')^2}}{2}\right]^{-\frac{1}{2}}$$

where, $\lambda_0 = c/f$ is a free space wavelength of the CPW, $\lambda_s$ is an average wavelength of the CPW in the rotor winding, and when a perimeter for a single turn of the rotor winding is an integer multiple of ½ of the wavelength of the transmitted electromagnetic wave, namely:

$$l = \dfrac{n\lambda_s}{2},$$

n being a positive integer, a propagation coefficient $T^2$ can be given by:

$$T^2 = \exp\left[-\dfrac{2n\pi \varepsilon_r''}{\varepsilon_r' + \sqrt{(\varepsilon_r')^2 + (\varepsilon_r'')^2}} - j2n\pi\right],$$

The propagation coefficient may truly reflect a time constant of an inductive impedance of an internal resistance.

The present disclosure couples the circularly polarized electromagnetic wave to each turn of circular waveguide matching load coil with a same time constant, and has characteristics of a transient pulse vibration wave signal source. Time of a unidirectional flux formed by each turn is highly related to time that the CPW passes through a physical perimeter of each turn. When the CPW reaches the second turn, a part of energy is returned to the first turn, and a part of energy is returned to the second turn from the third turn and then returned to the first turn. That is, a total flux of the first turn keeps unchanged, and a total flux of the second turn also keeps unchanged. The signal emission source continues to keep the CPW unchanged in polarization direction clockwise or counter-clockwise, such that the first turn, the second turn and the third turn of each of the positive electrode and the negative electrode keep a total flux to reflect intrinsic characteristics. By the same reasoning, a forward inter-turn characteristic waveform for 62 turns (such as the full-speed 650-MW rotor) can be obtained. As shown in FIG. 1, a reverse inter-turn characteristic waveform can be obtained by counter-clockwise coupling a CPW.

Embodiment 2

Figure 15:
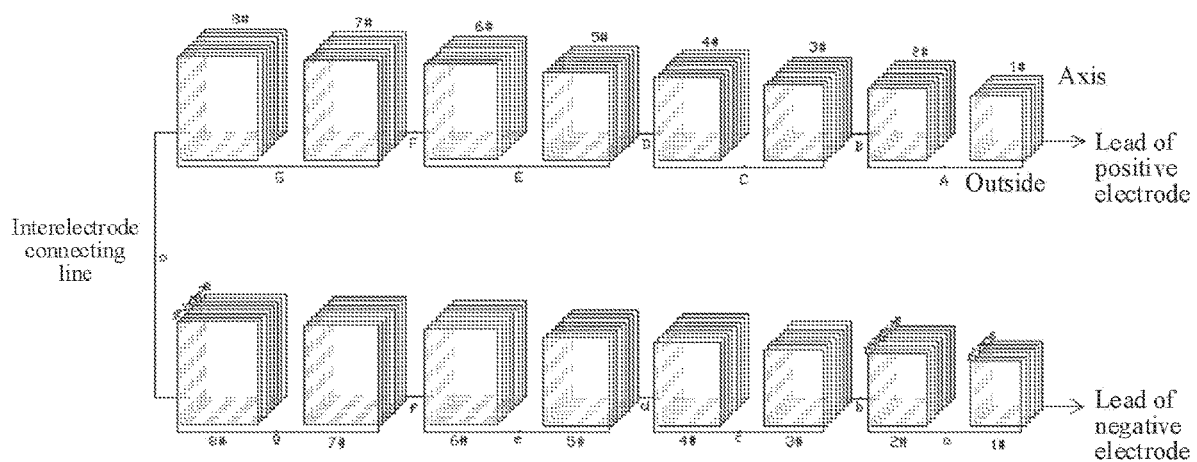
FIG. 15 is a schematic view of a 1 #coil, a 2 #coil, a 3 #coil, a 4 #coil, a 5 #coil, a 6 #coil, a 7 #coil and an 8 #coil of a full-speed 650-MW rotor according to Embodiment 2 to Embodiment 4.

A bridge line for a 1 #coil and a 2 #coil in a full-speed 650-MW rotor is as shown by A and a in FIG. 15.

Figure 9:
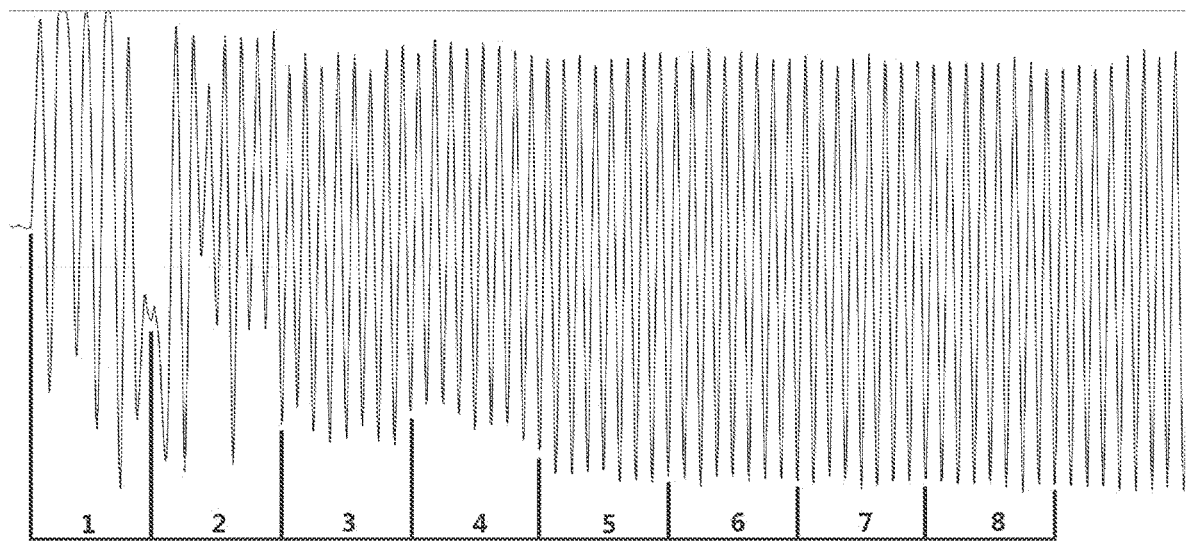
FIG. 9 is a schematic view according to Embodiment 2.

As shown in FIG. 9, 62 turns for coils 1-8 #in the 1 #full-speed 650-MW health rotor are all clear. The bridge line for the 1 #coil and the 2 #coil has obvious characteristics. Characteristics of a transient wave for each turn of the rotor are healthy.

Figure 10:
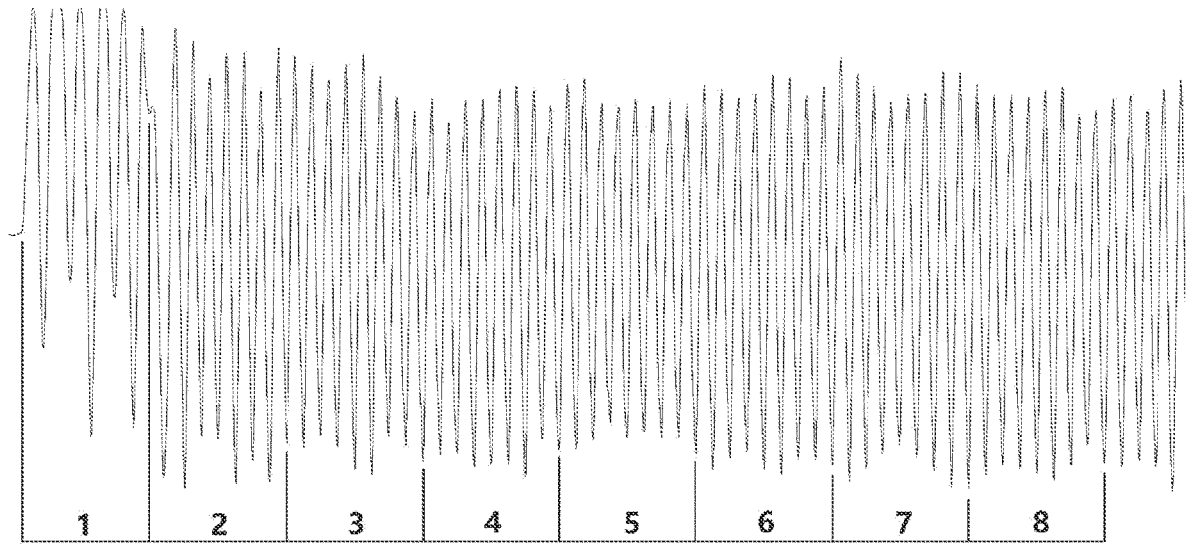
FIG. 10 is a schematic view according to Embodiment 2.

As shown in FIG. 10, 62 turns for coils 1-8 #in the 2 #full-speed 650-MW health rotor are all clear. The bridge line for the 1 #coil and the 2 #coil has obvious characteristics.

Characteristics of a transient wave for each turn of the rotor are healthy.

Embodiment 3

A bridge line for a 1 #coil and a 2 #coil in a full-speed 650-MW rotor is as shown by A and a in FIG. 15.

Figure 11:
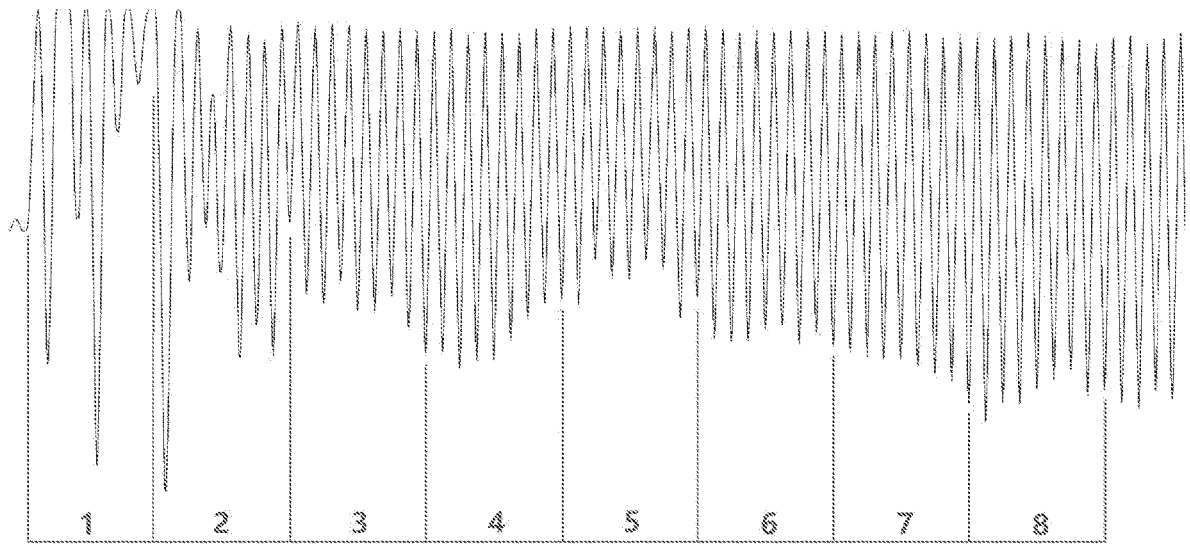
FIG. 11 is a schematic view according to Embodiment 3.

As shown in FIG. 11, 62 turns for coils 1-8 #in the 2 #full-speed 650-MW sub-healthy rotor are clear, except that the fifth turn and the sixth turn of the 1 #coil are combined into one sinusoidal wave. Characteristics of the bridge line for the 1 #coil and the 2 #coil are not obvious. Sinusoidal waves for the first turn and the second turn of the 2 #coil have an excessively large amplitude compared with a previous cycle. It is determined that the coil has oil pollution, and needs to be cleaned.

Embodiment 4

A bridge line for a 1 #coil and a 2 #coil in a full-speed 650-MW rotor is as shown by A and a in FIG. 15.

Figure 12:
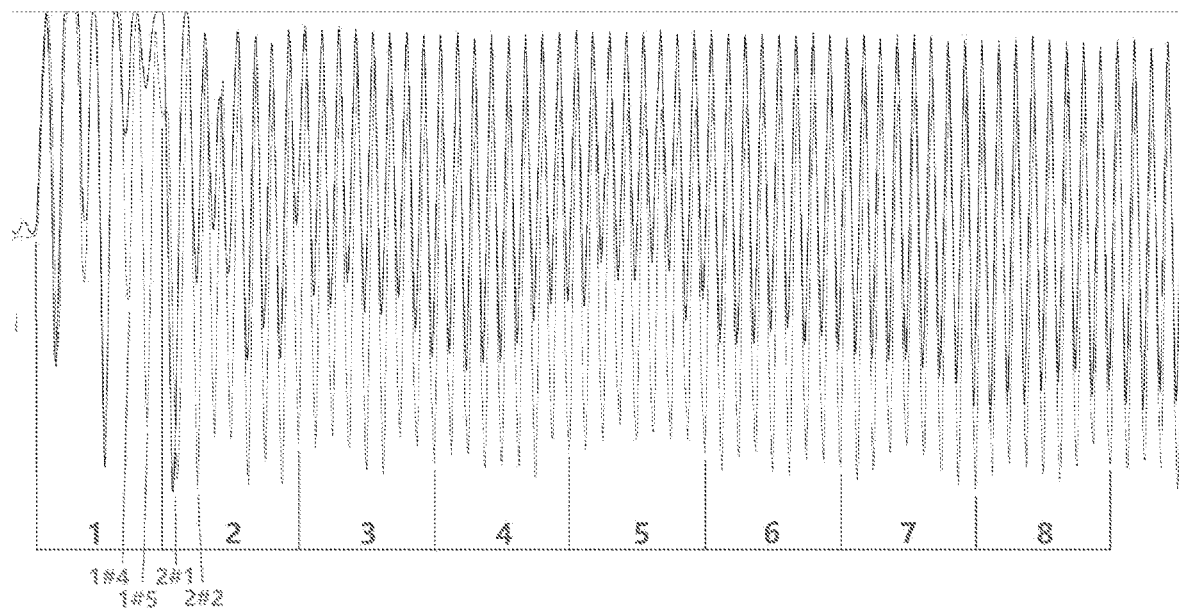
FIG. 12 is a schematic view according to Embodiment 4.

As shown in FIG. 12, characteristics of transient waves of the 2 #full-speed 650-MW rotor in two times of overhauling are compared. The light color shows a waveform of each turn of a normal rotor, and the dark color shows a waveform of each turn of an oil polluted rotor.

First to third turns of the 1 #coil overlap completely, fourth to fifth turns of the 1 #coil tend to separate, a sixth turn of the 1 #coil completely disappears, a first turn of the 2 #coil has a phase difference, and a second turn of the 2 #coil to an eighth turn of the 8 #coil are normal. Through analysis, oil pollution exists at the fifth and sixth turns of the 1 #coil and at the first turn of the 2 #coil, and is located at the bridge line for the 1 #coil and the 2 #coil. With overhauling for verification, the test is completely correct.

Embodiment 5

Figure 13:
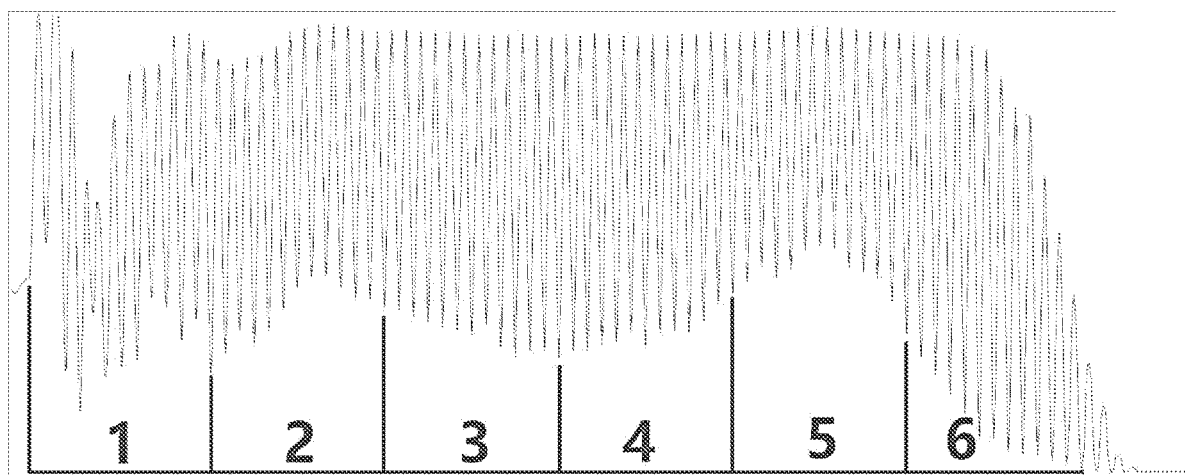
FIG. 13 is a schematic view according to Embodiment 5.

FIG. 13 shows characteristics of a transient wave of a 2 #full-speed 390H rotor in annual A inspection. The coils 1-5 #are normal, and the 6 #coil has winding deformation.

Embodiment 6

Figure 14:
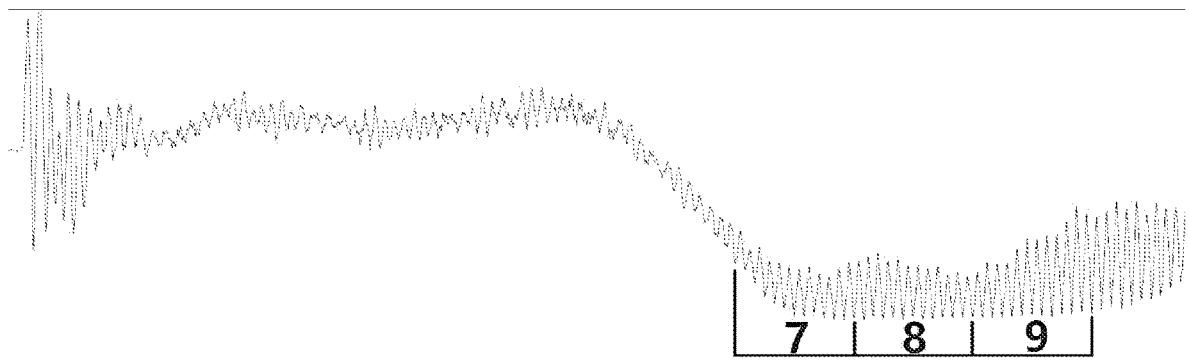
FIG. 14 is a schematic view according to Embodiment 6.

As shown in FIG. 14, characteristics of a transient wave of the 2 #full-speed 390H rotor in annual A inspection are shown. The coils 1-5 #and 7-9 #are normal, and the 6 #coil has winding deformation.

What is claimed is:

1. A device for detecting an inter-turn electromagnetic pulse vibration wave characteristic of a turbogenerator rotor winding, comprising an ultra-large-capacity internal resistance signal source, wherein the ultra-large-capacity internal resistance signal source is connected to an ultra-high-speed time sequence control circuit, the ultra-high-speed time sequence control circuit is connected to a positive electrode and a negative electrode of a rotor winding through a parasitic inductive power supply via a positive electrode load wave guiding line and negative electrode load wave guiding line, and the positive electrode and the negative electrode of the rotor winding are connected to an ultra-high-speed acquisition circuit through an operational amplifier circuit;

the ultra-large-capacity internal resistance signal source matches with an average time constant of a circular polarization characteristic for each turn of the winding, and generates an energy width of a power circular polarization characteristic wave matching with a full response time constant of the rotor winding;

the parasitic inductive power supply performs circular waveguide coupling exchange on input and output coupling circularly polarized waves (CPWs) of the positive electrode and the negative electrode;

the positive electrode load wave guiding line and the negative electrode load wave guiding line couple CPWs concurrently to a positive electrode and a negative electrode of a rotor;

the operational amplifier circuit combines, couples and amplifies signals for concurrent circularly polarized transmission and reception; and the ultra-high-speed acquisition circuit acquires a waveform depending on a circularly polarized dual-signal emission source, an induced polarization source at each turn, a disymmetric circularly polarized waveguide load, and a time constant for maintaining energy of the signal source.

2. A method for detecting an inter-turn electromagnetic pulse vibration wave characteristic of a turbogenerator rotor winding, comprising: performing detection with the device for detecting the inter-turn electromagnetic pulse vibration wave characteristic of the turbogenerator rotor winding according to claim 1, wherein the ultra-large-capacity internal resistance signal source and the ultra-high-speed time sequence control circuit generate a high-potential abrupt electric field for an avalanche polarized edge;

circularly polarized electromagnetic waves generated by the parasitic inductive power supply and symmetrically deflecting by 180° are respectively coupled to the positive electrode and the negative electrode of the rotor clockwise or counter-clockwise through the positive electrode load wave guiding line and the negative electrode load wave guiding line;

a first turn on the positive electrode and a first turn on the negative electrode are mutually induced to generate a first sinusoidal wave;

as time goes on, energy is returned to the parasitic inductive power supply, and is sequentially conducted to a second turn;

the parasitic inductive power supply and the second turn further start feeding back energy in circular polarization;

all turns sequentially perform feedback and superposition one another stage by stage; and all coupling turns show sinusoidal waves with a same time constant.

3. The method for detecting the inter-turn electromagnetic pulse vibration wave characteristic of the turbogenerator rotor winding according to claim 2, wherein when time of a unidirectional energy field for clockwise maintaining circularly polarized transmission of the positive electrode and time of a unidirectional energy field for clockwise maintaining 180°-deflecting circularly polarized transmission of the negative electrode are greater than a full-length waveguide time of the rotor winding at the same time, each turn of a symmetric winding shows a characteristic waveform of a signal source and load superposed dual electromagnetic pulse vibration wave;

through self-induction and mutual induction, a CPW waveform formed by a present turn is synchronously superposed and coupled in time to obtain a forward changing flux from top to bottom;

if the present turn has a complete sinusoidal wave, and a wavelength time constant changes little, the present symmetric turn has a complete electromagnetic characteristic;

if the present turn has an incomplete sinusoidal wave, and a wavelength of a forward and backward superposed sinusoidal wave is greater than a standard time constant, the present turn is defective and has an early hazard such as deformation, oil pollution, slot wedge loosening or displacement, and an early inter-turn short circuit.

4. The method for detecting the inter-turn electromagnetic pulse vibration wave characteristic of the turbogenerator rotor winding according to claim 2, wherein a unidirectional energy field counter-clockwise applied for circular polarization of the positive electrode and a unidirectional energy field counter-clockwise applied for 180°-deflecting circular polarization of the negative electrode are acquired symmetrically for comparison;

two CPWs with a same rotation direction are used to couple a counter-clockwise CPW waveform formed by a present turn to form a reversely changing flux from bottom to top; and a defective turn is verified repeatedly to determine a position of a defect on the positive electrode and the negative electrode.

5. The method for detecting the inter-turn electromagnetic pulse vibration wave characteristic of the turbogenerator rotor winding according to claim 2, wherein when a unit length of a load on each turn of the rotor is an integer multiple of a wavelength of a transmitted CPW, a load of the tested rotor is a dielectric material with Ur=1, and an electromagnetic wave has an attenuation constant and a phase constant given by:

$$\begin{cases} \alpha_s = 2\left(\dfrac{\pi f}{c}\right)^2 \dfrac{\varepsilon_r''}{\beta_s} \\ \beta_s = \dfrac{2\pi f}{c}\left(\dfrac{\varepsilon_r' + \sqrt{(\varepsilon_r')^2 + (\varepsilon_r'')^2}}{2}\right)^{\frac{1}{2}} \end{cases}$$

where $\alpha_s$ is the attenuation constant, $\beta_s$ is the phase constant, c is a light velocity in vacuum, f is a frequency of the generated electromagnetic wave, $\varepsilon_s$ is a permittivity of free space and is specifically $10^{-9}/36\pi$ F/m, $\varepsilon_r$ is a relative dielectric constant for each turn of the winding, and $\varepsilon_r = \varepsilon_r' - j\varepsilon_r''$, $\varepsilon_r'$ being a real part of the relative dielectric constant for each turn of the winding, and $\varepsilon_r''$ being an imaginary part of the relative dielectric constant for each turn of the winding; and the wavelength of the CPW in the rotor winding is given by:

$$\lambda_s = \dfrac{2\pi}{\beta_s} = \lambda_0 \left[\dfrac{\varepsilon_r' + \sqrt{(\varepsilon_r')^2 + (\varepsilon_r'')^2}}{2}\right]^{-\frac{1}{2}}$$

wherein, $\lambda_0 = c/f$ is a free space wavelength of the CPW, $\lambda_s$ is an average wavelength of the CPW in the rotor winding, and when a perimeter for a single turn of the rotor winding is an integer multiple of ½ of the wavelength of the transmitted electromagnetic wave, specifically $$l = \dfrac{n\lambda_s}{2},$$

n being a positive integer, a propagation coefficient $T^2$ is given by:

$$T^2 = \exp\left[-\dfrac{2n\pi\varepsilon_r''}{\varepsilon_r' + \sqrt{(\varepsilon_r')^2 + (\varepsilon_r'')^2}} - j2n\pi\right]$$

wherein the propagation coefficient truly reflects a time constant of an inductive impedance of an internal resistance.

* * * * *